(12) United States Patent
Chen et al.

(10) Patent No.: US 7,679,167 B2
(45) Date of Patent: Mar. 16, 2010

(54) ELECTRONIC ASSEMBLY FOR IMAGE SENSOR DEVICE AND FABRICATION METHOD THEREOF

(75) Inventors: Teng-Sheng Chen, Hsinchu (TW); Pai-Chun Peter Zung, Hsinchu (TW); Tzu-Han Lin, Hsinchu (TW); Shin-Chang Shiung, Taichung (TW)

(73) Assignee: Visera Technologies Company, Limited, Hsinchu (TW)

( * ) Notice: Subject to any disclaimer, the term of this patent is extended or adjusted under 35 U.S.C. 154(b) by 210 days.

(21) Appl. No.: 11/707,110

(22) Filed: Feb. 16, 2007

(65) Prior Publication Data

US 2008/0164550 A1 Jul. 10, 2008

(51) Int. Cl.
*H01L 23/552* (2006.01)

(52) U.S. Cl. .......................... 257/659; 438/25

(58) Field of Classification Search ................. 257/659, 257/660, E23.021; 438/25, 29
See application file for complete search history.

(56) References Cited

U.S. PATENT DOCUMENTS

| 5,400,072 A * | 3/1995 | Izumi et al. ............... 348/335 |
| 6,777,767 B2 * | 8/2004 | Badehi ...................... 257/432 |
| 7,456,083 B2 * | 11/2008 | Noma et al. .............. 438/460 |
| 2007/0052827 A1 * | 3/2007 | Hiltunen ................... 348/294 |
| 2008/0111223 A1 * | 5/2008 | Yu et al. .................... 257/678 |

* cited by examiner

*Primary Examiner*—Andy Huynh
*Assistant Examiner*—Kimberly M Thomas
(74) *Attorney, Agent, or Firm*—Muncy, Geissler, Olds & Lowe, PLLC

(57) ABSTRACT

A package module for an image sensor device is disclosed. The package module comprises a device chip disposed between lower and upper substrates. A first conductive layer is over a first sidewall of the lower substrate and insulated from the device chip. A first protective layer is on the first conductive layer and exposes a portion of the first conductive layer over the first sidewall of the lower substrate. A first pad is on the bottom surface of the lower substrate and is electrically connected to the first conductive layer. The invention also discloses an electronic assembly for an image sensor device and a fabrication method thereof.

28 Claims, 6 Drawing Sheets

ELECTRONIC ASSEMBLY FOR IMAGE SENSOR DEVICE AND FABRICATION METHOD THEREOF

BACKGROUND OF THE INVENTION

1. Field of the Invention

The invention relates to image sensor technology and more particularly to a package module and an electronic assembly for an image sensor device with electromagnetic interference (EMI) shielding.

2. Description of the Related Art

Charge coupled devices (CCD) and complementary metal oxide semiconductor CMOS image sensor devices are widely used in digital imaging applications. Image capture technology is well known to consumers due to the proliferation of devices employing image sensor devices, including digital cameras, digital video recorders, image capture capable mobile phones, and monitors.

A typical image sensor device includes an array of pixel diodes, control circuitry, an analogue to digital converter, and an amplifier. Regardless of whether these devices are on the same chip as the sensor device, in the camera module or on the printed circuit board (PCB), protection against electromagnetic interference EMI resulting from electromagnetic radiation is a design challenge. If EMI protection can not be designed into a package module or electronic assembly of an image sensor device performance may suffer.

BRIEF SUMMARY OF THE INVENTION

A detailed description is given in the following embodiments with reference to the accompanying drawings. A package module for an image sensor device, an electronic assembly for an image sensor device and a fabrication method thereof are provided. An embodiment of a package module for an image sensor device comprises a device chip disposed between lower and upper substrates. A first conductive layer is disposed over a first sidewall of the lower substrate and is insulated from the device chip. A first protective layer is on the first conductive layer and exposes a portion of the first conductive layer over the first sidewall of the lower substrate. A first pad is on the bottom surface of the lower substrate and is electrically connected to the first conductive layer.

An embodiment of an electronic assembly for an image sensor device comprises a lens set, a package module, and an opaque conductive layer. The lens set is mounted on the package module. The package module comprises lower and upper substrates with a device chip disposed therebetween. A first conductive layer is over a first sidewall of the lower substrate and is insulated from the device chip. A first protective layer is on the first conductive layer and exposes a portion of the first conductive layer over the first sidewall of the lower substrate. A first pad is on the bottom surface of the lower substrate and is electrically connected to the first conductive layer. The opaque conductive layer is disposed on the sidewall of the lens set and is electrically connected to the first conductive layer.

An embodiment of a method for fabricating an electronic assembly for an image sensor device comprises providing a package module comprising a device chip disposed between lower and upper substrates. A first conductive layer is over a first sidewall of the lower substrate and insulated from the device chip. A first conductive layer is over a first sidewall of the lower substrate and is insulated from the device chip. A first pad is on the bottom surface of the lower substrate and is electrically connected to the first conductive layer. The first protective layer is partially removed to expose a portion of the first conductive layer over the first sidewall of the lower substrate. A lens set is mounted on the package module. An opaque conductive layer is formed on the sidewall of the lens set directly on the exposed portion of the first conductive layer. The package module with the lens set is mounted on a printed circuit board comprising a grounding pad therein.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
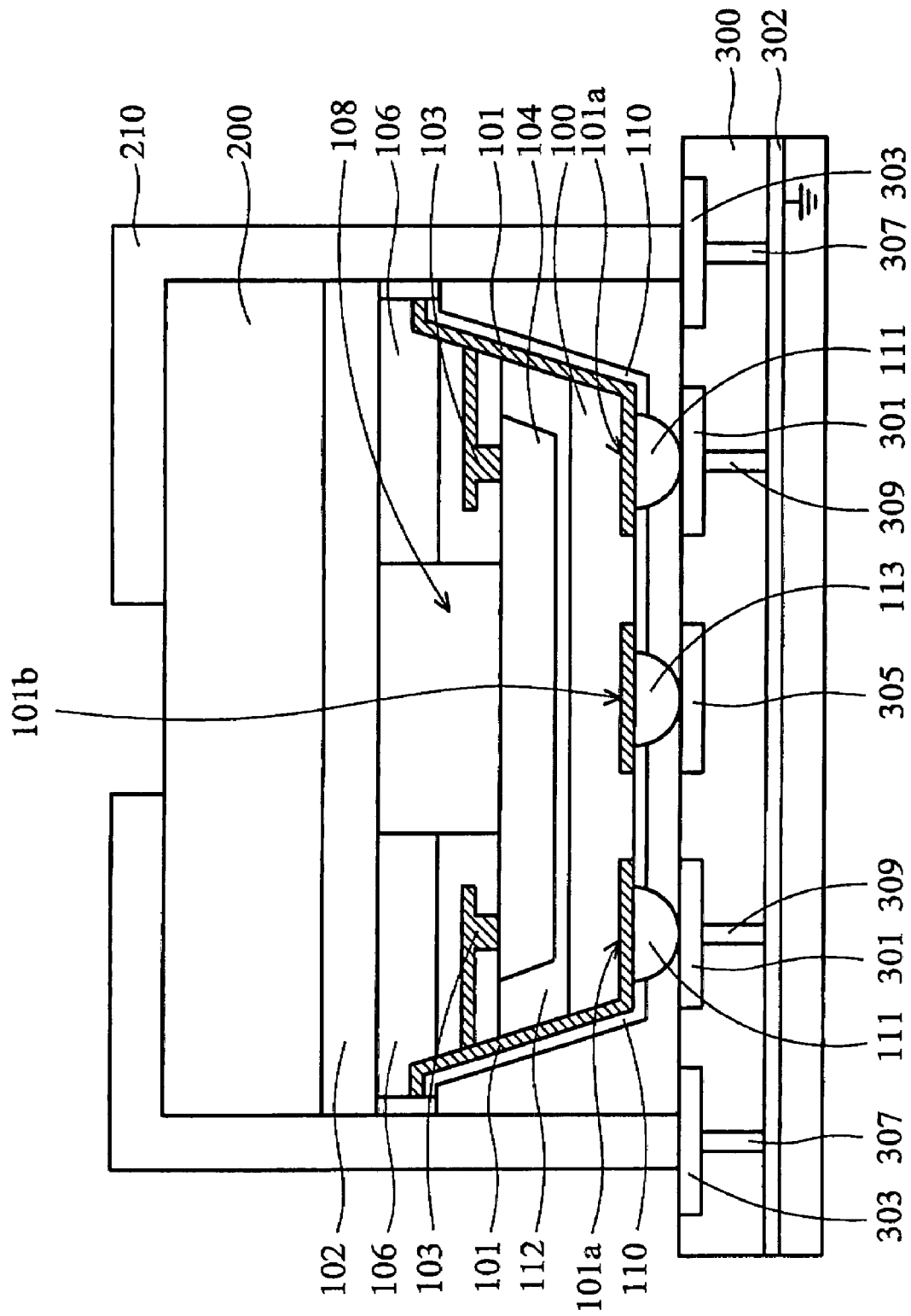
FIG. 1 is a cross section of an electronic assembly for an image sensor device known to the inventors.

FIG. 1 demonstrates an electronic assembly for an image sensor device known to the inventors. This is not prior art for the purposes of determining the patentability of the invention. This merely shows a problem founded by the inventors.

As shown in FIG. 1, the electronic assembly comprises an image sensor chip scale package (CSP) module and a lens set 200 sequentially mounted on a printed circuit board (PCB) 300. The CSP module comprises a device chip 104, such as such as a charge-coupled device (CCD) image sensor chip or CMOS image sensor chip, is interposed between lower and upper substrates 100 and 102 comprising glass, quartz or other transparent material. The device chip 104 is adhered to the lower substrate 100 via an epoxy layer 112 and is adhered to the upper substrate 102 via a spacer (or dam) 106 forming a cavity 108 therebetween. A micro-lens array (not shown) may be formed on the device chip 104 in the cavity 108. A conductive layer 101 is disposed along the sidewall and the bottom of the lower substrate 100. Typically, the conductive layer 101 on the bottom of the lower substrate 100 is patterned to form grounding pads of the CSP module and signal pads. In order to simplify the diagram, only two grounding pads 101a of the CSP module and one signal pad 101b are depicted. The conductive layer 101 over the sidewall of the lower substrate 100 laterally contact grounding pads 103 of the device chip 104 to electrically connect the grounding pads 101a of the CSP module and grounding pads 103 of the device chip 104. A protective layer 110 covers the conductive layer 101. The protective layer 110 at the bottom of the lower substrate 100 is patterned to expose the pads 101a and 101b. Solder balls 111 and 113 are respectively disposed on the corresponding pads 101a and 101b.

A lens set 200 comprising a stack of multiple lenses (not shown) is mounted on the CSP module to form a compact camera module (CCM). The CCM is mounted on the PCB 300 via solder balls 111 and 113. The solder balls 111 are electrically connected to a grounding layer 302 inside the PCB 300 through grounding pads 301 of the PCB 300 and plugs 309 thereunder. The solder ball 113 is electrically connected to the circuits (not shown) on the PCB 300 through a pad 305.

In order to suppress EMI, a metal housing 210 covers the CCM and is electrically connected to the grounding layer 302 through grounding pads 303 of the PCB 300 and plugs 307 thereunder. The metal housing 210 for EMI shielding, however, increase the total volume of the CCM, thus, reducing the size and weight of the CCM is difficult. Moreover, the metal housing for EMI shielding increases manufacturing cost. The inventors have discovered that the following method for fabricating an electronic assembly for an image sensor device can integrate the semiconductor technology with EMI shielding technology without requiring use of a metal housing.

Accordingly, the invention relates to an electronic assembly for an image sensor device and a method for fabricating the same, capable of suppressing EMI problems without requiring use of a metal housing for EMI shielding. FIG. 2E illustrates an embodiment of an electronic assembly for an image sensor. Elements in FIG. 2E that are the same as those in FIG. I are labeled with the same reference numbers as in FIG. I and are not described again for brevity. The electronic assembly for the image sensor device comprises a CCM mounted on a PCB 300, comprising a lens set 200, a package module and an opaque conductive layer 220. Similar to the package module shown in FIG. 1, the grounding pad 103 of the device chip 104 is electrically connected to the grounding layer 302 inside the PCB 300 through the conductive layer 101, the pad 101a, the solder ball 111, the grounding pad 301 of the PCB 300 and the plug 309 formed in the PCB 300. Unlike the package module shown in FIG. 1, however, the package module shown in FIG. 2E further comprises a conductive layer 117 similar to the conductive layer 101 on a sidewall 100b of the lower substrate 100, overlying a sidewall 100a of the lower substrate 100, but is insulated from the device chip 104. That is, the conductive layer 117 is not connected to any part of grounding pad 103 of the device chip 104 or other input/output pad 119 of the device chip 104, such that the conductive layer 117 is insulated from the devices or circuits (not shown) of the device chip 104. In this embodiments, the conductive layers 101 and 117 and the pads 111, 113 and 115 comprise a single layer, respectively. In some embodiments, the conductive layers 101 and 117 and the pads 111, 113 and 115 may comprise a multi-layer structure. Typically, the multi-layer structure may comprise a plurality layers and a plurality of plugs disposed therebetween for electrical connection.

Moreover, the conductive layer 117 extends to the bottom of the lower substrate 100 to form a pad 117a for electrically connecting to the grounding layer 302 through a solder ball 115 formed on the pad 117a and a grounding pad 321 of the PCB 300 and a plug 323 formed in the PCB 300. A protective layer 130a covers the conductive layer 117 and exposes a portion of the conductive layer 117 over the sidewall 100a of the lower substrate 100. The opaque conductive layer 220 is disposed on the sidewall of the lens set 200 and is electrically connected to the conductive layer 117. The opaque conductive layer 220 may, for example, extend onto the package module to directly contact the exposed portion of the conductive layer 117 over the sidewall 100a of the lower substrate 100. In this embodiment, the opaque conductive layer 220 may comprise metal or other suitable EMI shielding materials. Additionally, because the conductive layer 220 is opaque it may serve as a light-shielding layer.

The opaque conductive layer 220, the conductive layer 117, the pad 117a and the solder ball 115, rather than the metal housing 210 shown in FIG. 1, serve to suppress EMI.

Figure 2A:
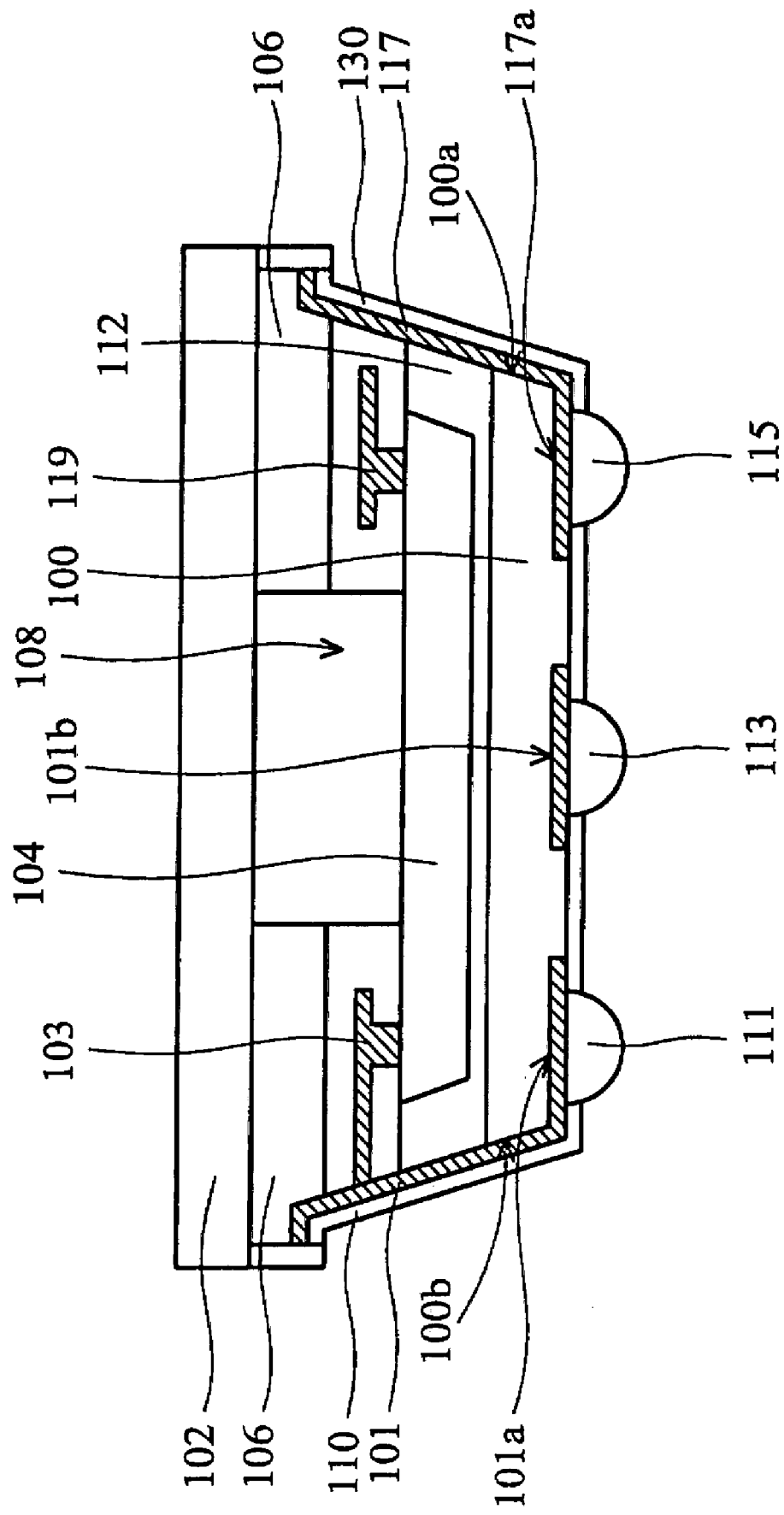
FIGS. 2A to 2E are cross sections of an exemplary embodiment of an electronic assembly for an image sensor device.
Figure 2B:
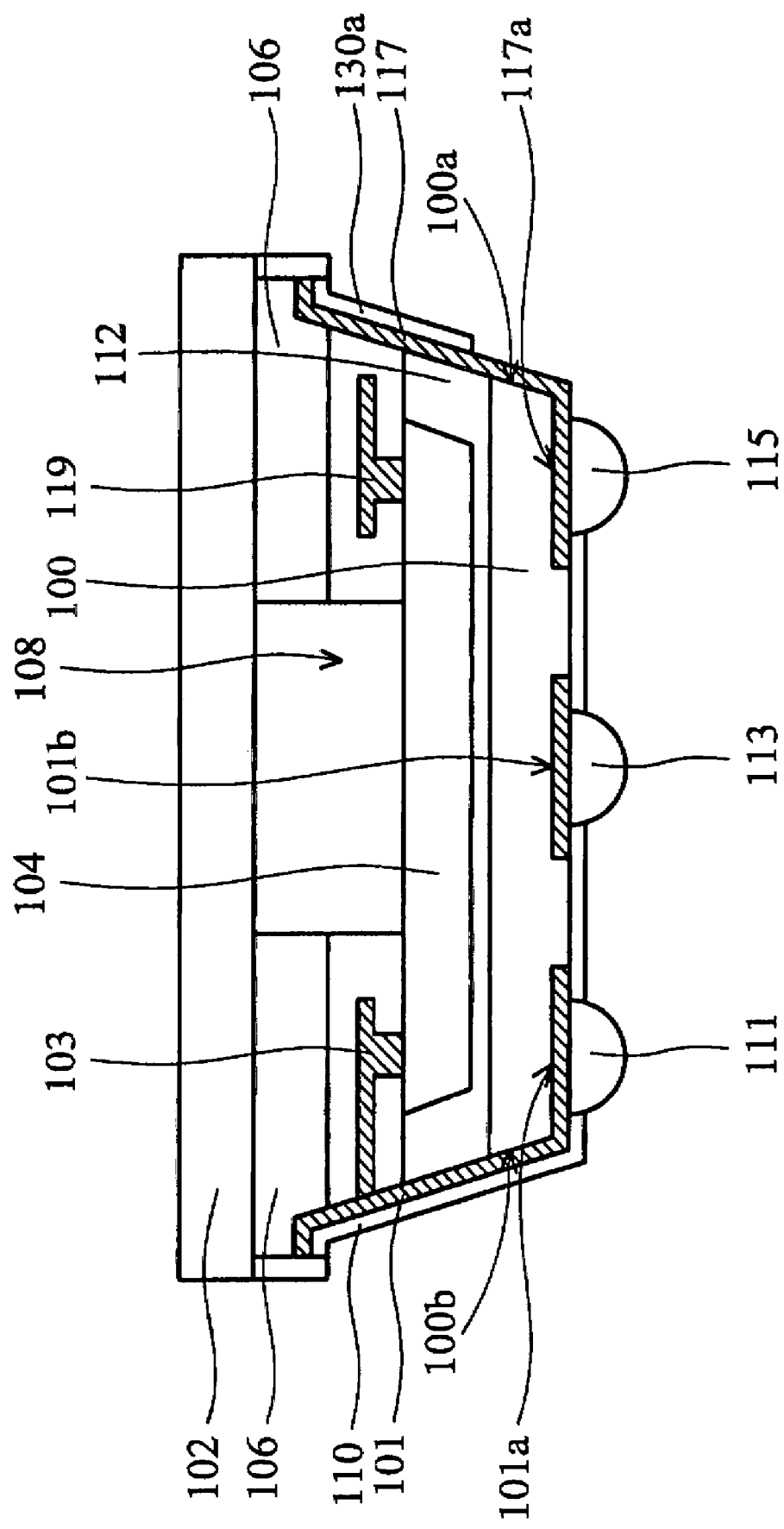
Figure 2C:
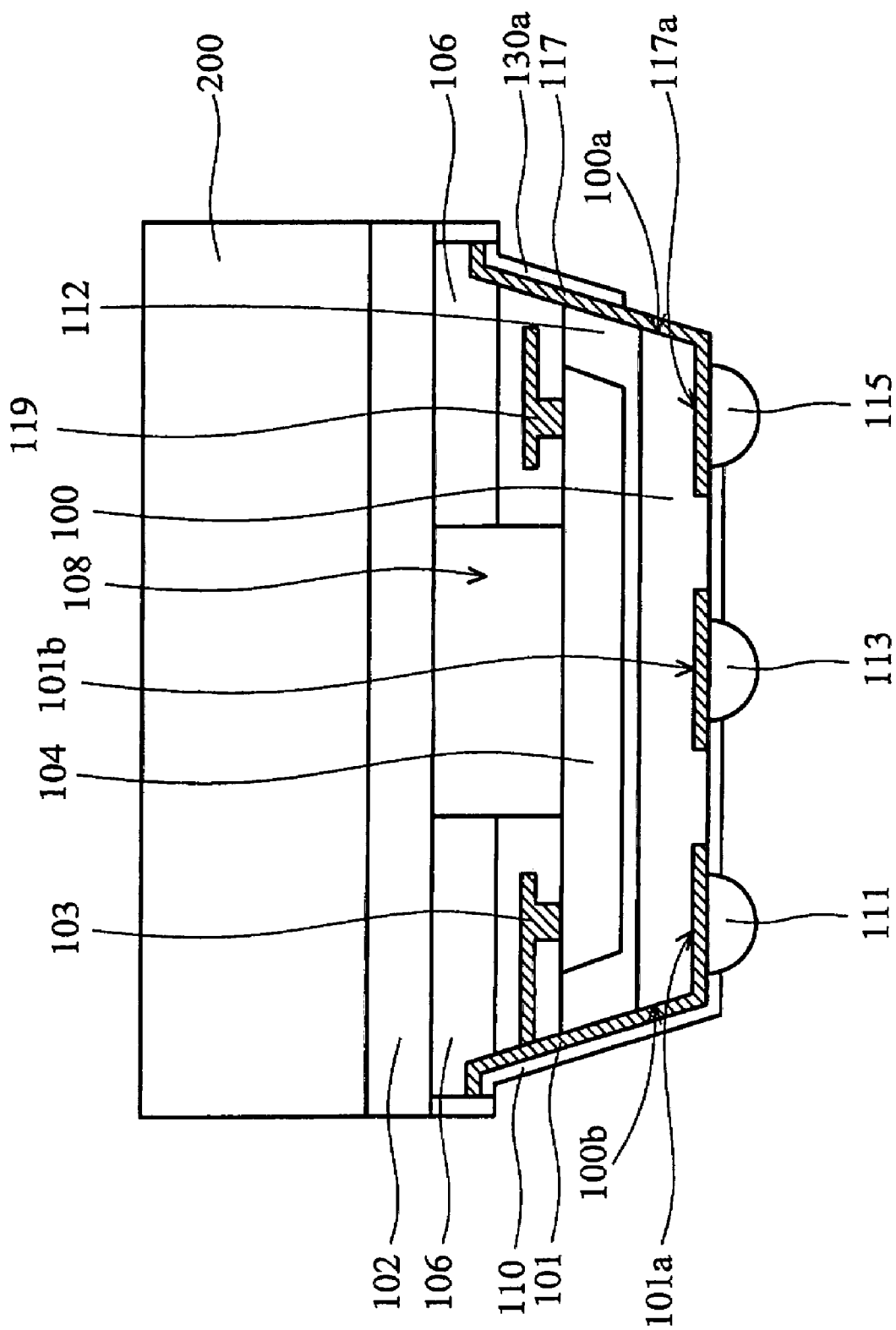
Figure 2D:
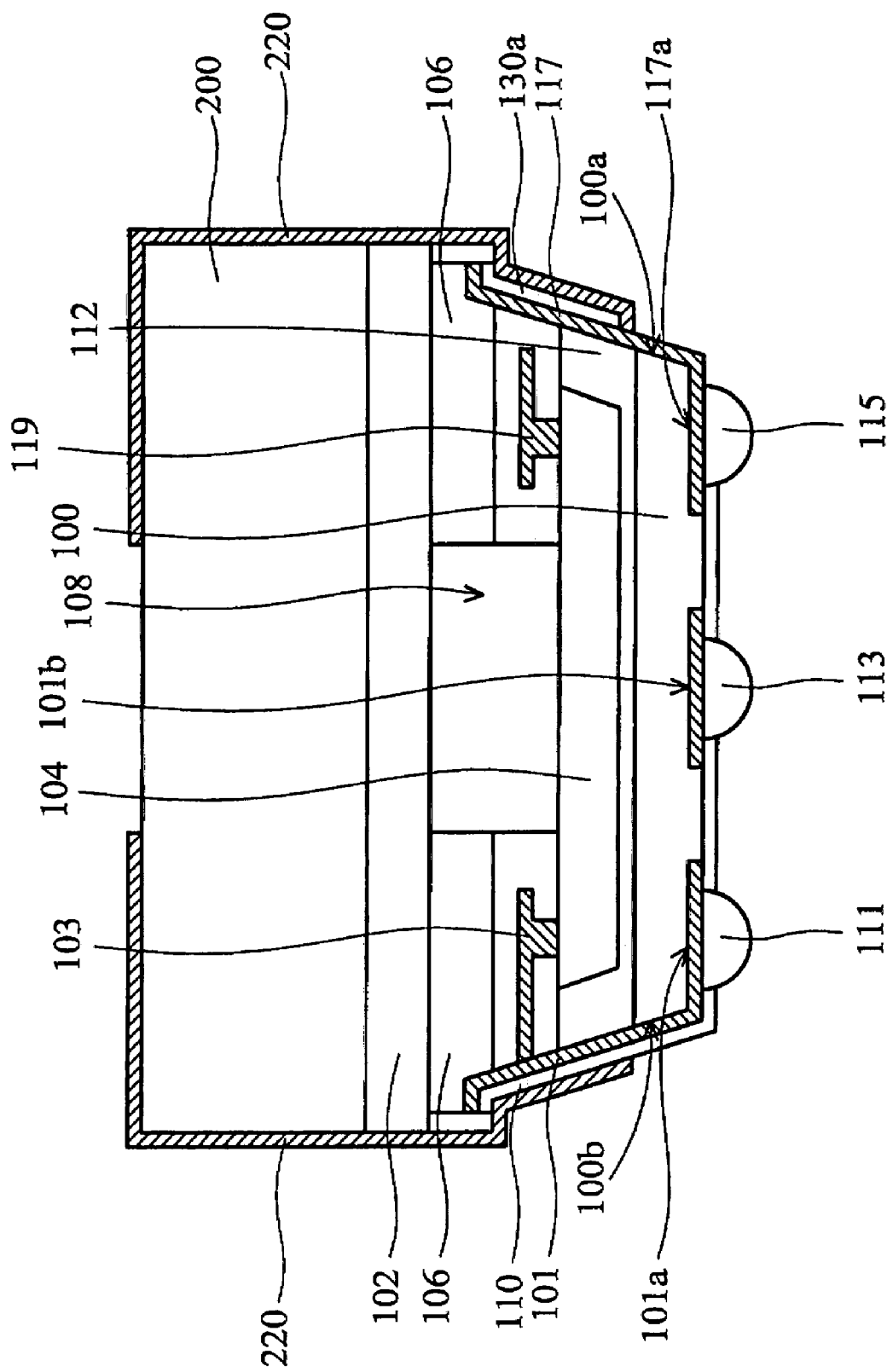
Figure 2E:
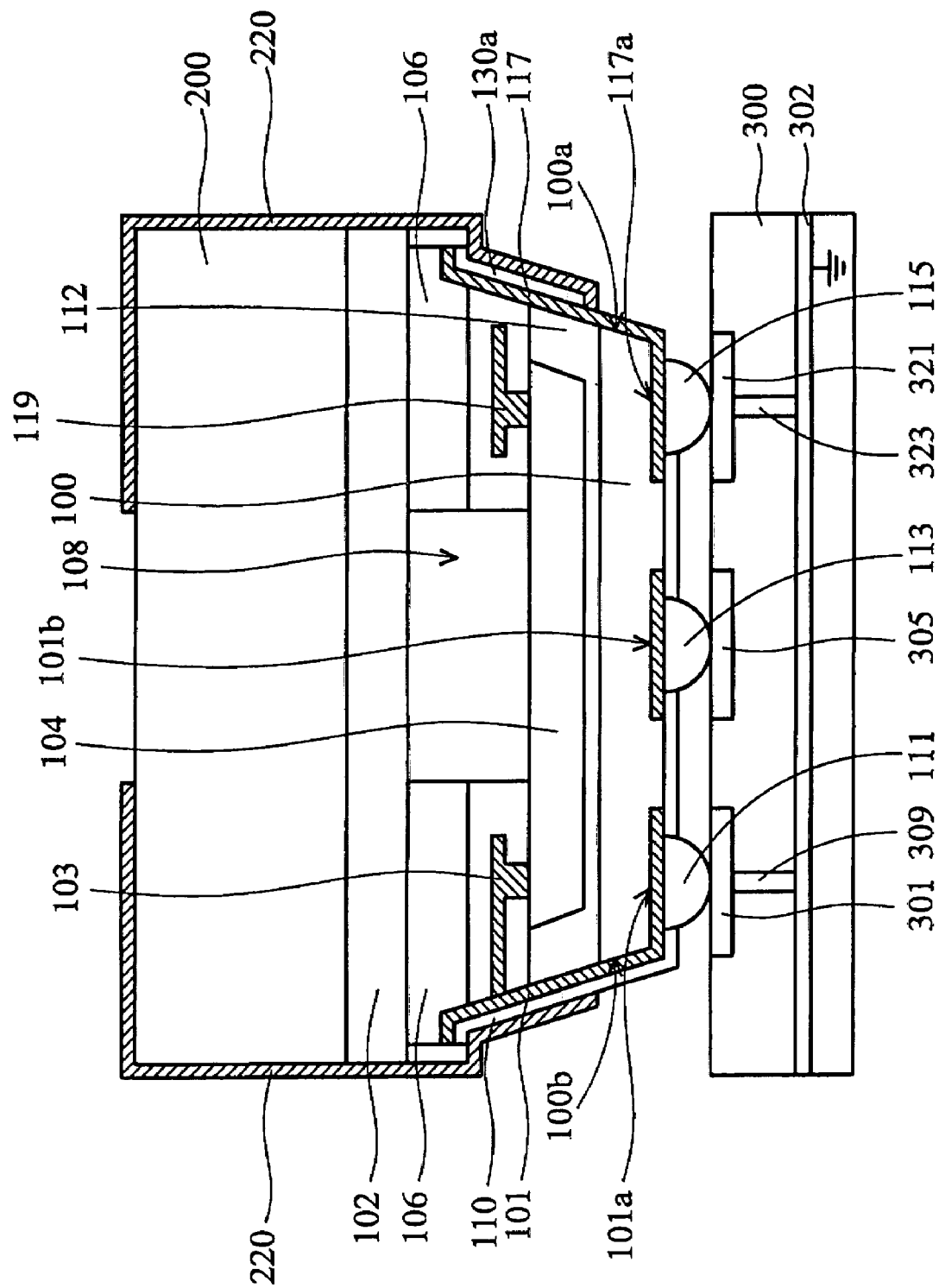

FIGS. 2A to 2E are cross sections of an exemplary embodiment of an electronic assembly for an image sensor device. Elements in FIGS. 2A to 2E that are the same as those in FIG. 1 are labeled with the same reference numbers as FIG. 1 and are not described again for brevity. As shown in FIG. 2A, a package module is provided. The package module may be fabricated by CSP, wafer level CSP or other conventional package technology. In this embodiment, the package module is preferably fabricated by CSP. The package module is similar to that shown in FIG. 1, with the arrangement of a conductive layer 117 covered by a protective layer 130 being the difference. More particularly, the conductive layer 117 over a sidewall 100a of the lower substrate 100 is insulated from the device chip 104. That is, the conductive layer 117 is not connected to a grounding pad 103 of the device chip 104 or other input/output pad 119 of the device chip 104, such that the conductive layer 117 is insulated from the devices or circuits (not shown) of the device chip 104. Moreover, the conductive layer 117 partially extends to the bottom surface of the lower substrate 100 to serve as a pad 117a. A solder ball 115 is disposed on the pad 117a for a subsequent mounting process.

As shown in FIG. 2B, the protective layer 130 is partially removed by conventional lithography and etching, to leave a portion of the protective layer 130a, thus, a portion of the protective layer 117 over the sidewall 100a of the lower substrate 100 is exposed. In some embodiments, the protective layer 130 may be partially removed to expose the portion of the protective layer 117 over the sidewall 100a of the lower substrate 100 prior to formation of solder balls 111, 113 and 115.

A lens set 200 is subsequently mounted on the package module, as shown in FIG. 2C. In this embodiment, the lens set comprising a stack of multiple lenses (not shown) does not use a housing or holder for mounting the lens set to the package module.

As shown in FIG. 2D, an opaque conductive layer 220 is deposited on the sidewall of the lens set 200 and the sidewall of the package module to directly contact the exposed conductive layer 117 over the sidewall 100a of the lower substrate 100. Thus, a CCM is completed. In this embodiment, the opaque conductive layer 220 may comprise metal or other EMI shielding materials and serve as a light shielding layer.

As shown in FIG. 2E, the CCM is electrically connected to a PCB 300. For example, the CCM is mounted on a PCB 300 through the solder balls 111, 113 and 115 formed on the CCM and the pads 301, 305 and 321 on the PCB 300 for the electrical connection. More particularly, the pad 301 is electrically connected to a grounding layer 302 inside the PCB 300 through a plug 309 for grounding the system. Moreover, the pad 321 is electrically connected to the grounding layer 302 through a plug 323 for EMI shielding. Thus, an electronic assembly for an image sensor device with EMI shielding is completed.

According to the invention, since the opaque conductive layer 220, the conductive layer 117, the pad 117a and the solder ball 115 can be utilized, rather than the metal housing 210 shown in FIG. 1, the size and weight of the CCM can be reduced. Moreover, since the electronic assembly for an image sensor device can be fabricated without forming an additional housing or cover for EMI shielding, the manufacturing cost can be reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package module for an image sensor device, comprising:
   a lower substrate and an upper substrate opposite thereto;
   a device chip disposed between the lower and upper substrates;
   a first conductive layer over a first sidewall of the lower substrate, insulated from the device chip;
   a first protective layer on the first conductive layer, exposing a portion of the first conductive layer over the first sidewall of the lower substrate; and
   a first pad on the bottom surface of the lower substrate, electrically connected to the first conductive layer.

2. The package module as claimed in claim 1, further comprising a spacer disposed between the device chip and the upper substrate to form a cavity therebetween.

3. The package module as claimed in claim 1, further comprising a solder ball disposed on the first pad.

4. The package module as claimed in claim 1, further comprising g:
   a grounding pad on the device chip;
   a second pad on the bottom surface of the lower substrate;
   a second conductive layer over a second sidewall of the lower substrate, electrically connected between the grounding pad and the second pad; and
   a second protective layer on the second conductive layer over the second sidewall of the lower substrate.

5. The package module as claimed in claim 4, further comprising a solder ball disposed on the second pad.

6. The package module as claimed in claim 4, wherein the first and second conductive layers and the first and second pads comprise a multi-layer structure, respectively.

7. The package module as claimed in claim 1, further comprising an epoxy layer disposed between the device chip and the lower substrate.

8. The package module as claimed in claim 1, wherein the device chip comprises a CCD or CMOS image sensor chip.

9. An electronic assembly for an image sensor device, comprising:
   a package module, comprising:
     a lower substrate and an upper substrate opposite thereto;
     a device chip disposed between the lower and upper substrates;
     a first conductive layer over a first sidewall of the lower substrate, insulated from the device chip unless the first conductive layer is electrically connected to a printed circuit board;
     a first protective layer on the first conductive layer, exposing a portion of the first conductive layer over the first sidewall of the lower substrate; and
     a first pad on the bottom surface of the lower substrate, electrically connected to the first conductive layer;
   a lens set mounted on the package module; and
   an opaque conductive layer disposed on the sidewall of the lens set and electrically connected to the first conductive layer.

10. The electronic assembly as claimed in claim 9, wherein the opaque conductive layer comprises metal.

11. The electronic assembly as claimed in claim 9, wherein the opaque conductive layer directly contacts the exposed portion of the first conductive layer.

12. The electronic assembly as claimed in claim 9, further comprising the printed circuit board mounted to the package module, comprising a grounding layer therein.

13. The electronic assembly as claimed in claim 12, further comprising a solder ball disposed on the first pad and electrically connected to the grounding layer.

14. The electronic assembly as claimed in claim 12, wherein the package module further comprises:
   a grounding pad on the device chip;
   a second pad on the bottom surface of the lower substrate;
   a second conductive layer over a second sidewall of the lower substrate, electrically connected between the grounding pad and the second pad; and
   a second protective layer on the second conductive layer over the second sidewall of the lower substrate.

15. The electronic assembly as claimed in claim 14, further comprising a solder ball disposed on the second pad and electrically connected to the grounding layer.

16. The package module as claimed in claim 14, wherein the first and second conductive layers and the first and second pads comprise a multi-layer structure, respectively.

17. The electronic assembly as claimed in claim 9, wherein the package module further comprises an epoxy layer disposed between the device chip and the lower substrate.

18. The electronic assembly as claimed in claim 9, wherein the package module further comprises a spacer disposed between the device chip and the upper substrate to form a cavity therebetween.

19. The electronic assembly as claimed in claim 9, wherein the device chip comprises a CCD or CMOS image sensor chip.

20. A method for fabricating an electronic assembly for an image sensor device, comprising:
   providing a package module, comprising:
     a lower substrate and an upper substrate opposite thereto;
     a device chip disposed between the lower and upper substrates;
     a first conductive layer over a first sidewall of the lower substrate, insulated from the device chip;
     a first protective layer on the first conductive layer; and
     a first pad on the bottom surface of the lower substrate, electrically connected to the first conductive layer;
   partially removing the first protective layer to expose a portion of the first conductive layer over the first sidewall of the lower substrate;
   mounting a lens set onto the package module;
   forming an opaque conductive layer on the sidewall of the lens set and directly on the exposed portion of the first conductive layer; and
   mounting the package module with the lens set on a printed circuit board comprising a grounding pad therein.

21. The method as claimed in claim 20, wherein the opaque conductive layer comprises metal.

22. The method as claimed in claim 20, further forming a solder ball between the first pad and the printed circuit board and electrically connected to the grounding layer.

23. The method as claimed in claim 20, wherein the package module further comprises:
   a grounding pad on the device chip;
   a second pad on the bottom surface of the lower substrate;
   a second conductive layer over a second sidewall of the lower substrate, electrically connected between the grounding pad and the second pad; and
   a second protective layer on the second conductive layer over the second sidewall of the lower substrate.

24. The method as claimed in claim 23, further forming a solder ball between the second pad and the printed circuit board and electrically connected to the grounding layer.

25. The package module as claimed in claim 23, wherein the first and second conductive layers and the first and second pads comprise a multi-layer structure, respectively.

26. The method as claimed in claim 20, wherein the package module further comprises an epoxy layer disposed between the device chip and the lower substrate.

27. The method as claimed in claim 20, wherein the package module further comprises a spacer disposed between the device chip and the upper substrate to form a cavity therebetween.

28. The method as claimed in claim 20, wherein the device chip comprises a CCD or CMOS image sensor chip.

* * * * *